(12) United States Patent
Lee et al.

(10) Patent No.: US 7,655,981 B2
(45) Date of Patent: *Feb. 2, 2010

(54) SUPERJUNCTION SEMICONDUCTOR DEVICE

(75) Inventors: Jae-gil Lee, Gyeonggi-do (KR); Jin-young Jung, Gyeonggi-do (KR); Ho-cheol Jang, Gyeonggi-do (KR)

(73) Assignee: Fairchild Korea Semiconductor Ltd., Kyungki-do (KR)

( * ) Notice: Subject to any disclaimer, the term of this patent is extended or adjusted under 35 U.S.C. 154(b) by 43 days.

This patent is subject to a terminal disclaimer.

(21) Appl. No.: 11/872,949

(22) Filed: Oct. 16, 2007

(65) Prior Publication Data

US 2008/0211053 A1 Sep. 4, 2008

Related U.S. Application Data

(63) Continuation of application No. 10/999,578, filed on Nov. 29, 2004, now Pat. No. 7,301,203.

(30) Foreign Application Priority Data

Nov. 28, 2003 (KR) ............... 10-2003-0085765

(51) Int. Cl.
*H01L 23/62* (2006.01)
*H01L 27/88* (2006.01)
*H01L 21/332* (2006.01)
*H01L 21/331* (2006.01)

(52) U.S. Cl. ............... 257/339; 257/341; 257/343; 257/401; 438/135; 438/309

(58) Field of Classification Search ............... 257/339, 257/341, 343, 401; 438/135, 309
See application file for complete search history.

(56) References Cited

U.S. PATENT DOCUMENTS 3,404,295 A 10/1968 Warner et al.

(Continued)

FOREIGN PATENT DOCUMENTS

CN 1036666 A 10/1989

(Continued)

OTHER PUBLICATIONS

P.M. Shenoy et al., Analysis of the Effect of change Imbalanace on the Stattic and Dynamic Characteristics of the Super Junction Mosfet , IEEE$ International Symposium on POwer semiconductor devices, 199, pp. 99-102(1999) ( also sumbitted by Applicants in thier IDS).*

(Continued)

*Primary Examiner*—Long Pham
*Assistant Examiner*—Steven H Rao
(74) *Attorney, Agent, or Firm*—Townsend and Townsend and Crew LLP (57) ABSTRACT

In accordance with an embodiment of the invention, a superjunction semiconductor device includes an active region and a termination region surrounding the active region. A central vertical axis of a boundary column of a second conductivity type material defines the boundary between the active region and the termination region. The active and termination regions include columns of first and second conductivity type material alternately arranged along a horizontal direction in a semiconductor region having top and bottom surfaces. At least one of the columns of the first conductivity type material in the termination region has a different width than a width of the columns of the first conductivity type material in the active region.

20 Claims, 2 Drawing Sheets

U.S. PATENT DOCUMENTS

| | | |
|---|---|---|
| 3,412,297 A | 11/1968 | Amlinger |
| 3,497,777 A | 2/1970 | Teszner et al. |
| 3,564,356 A | 2/1971 | Wilson |
| 3,660,697 A | 5/1972 | Berglund et al. |
| 4,003,072 A | 1/1977 | Matsushita et al. |
| 4,300,150 A | 11/1981 | Colak |
| 4,326,332 A | 4/1982 | Kenney et al. |
| 4,337,474 A | 6/1982 | Yukimoto |
| 4,345,265 A | 8/1982 | Blanchard |
| 4,445,202 A | 4/1984 | Geotze et al. |
| 4,579,621 A | 4/1986 | Hine |
| 4,636,281 A | 1/1987 | Buiguez et al. |
| 4,638,344 A | 1/1987 | Cardwell, Jr. |
| 4,639,761 A | 1/1987 | Singer et al. |
| 4,698,653 A | 10/1987 | Cardwell, Jr. |
| 4,716,126 A | 12/1987 | Cogan |
| 4,746,630 A | 5/1988 | Hui et al. |
| 4,754,310 A | 6/1988 | Coe |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,967,245 A | 10/1990 | Cogan et al. |
| 4,974,059 A | 11/1990 | Kinzer |
| 4,990,463 A | 2/1991 | Mori |
| 4,992,390 A | 2/1991 | Chang |
| 5,027,180 A | 6/1991 | Nishizawa et al. |
| 5,034,785 A | 7/1991 | Blanchard |
| 5,071,782 A | 12/1991 | Mori |
| 5,072,266 A | 12/1991 | Buluccea |
| 5,079,608 A | 1/1992 | Wodarczyk et al. |
| 5,105,243 A | 4/1992 | Nakagawa et al. |
| 5,111,253 A | 5/1992 | Korman et al. |
| 5,142,640 A | 8/1992 | Iwanatsu |
| 5,164,325 A | 11/1992 | Cogan et al. |
| 5,164,802 A | 11/1992 | Jones et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,262,336 A | 11/1993 | Pike, Jr. et al. |
| 5,268,311 A | 12/1993 | Euen et al. |
| 5,275,965 A | 1/1994 | Manning |
| 5,294,824 A | 3/1994 | Okada |
| 5,298,781 A | 3/1994 | Cogan et al. |
| 5,300,447 A | 4/1994 | Anderson |
| 5,326,711 A | 7/1994 | Malhi |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,434,435 A | 7/1995 | Baliga |
| 5,436,189 A | 7/1995 | Beasom |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,519,245 A | 5/1996 | Tokura et al. |
| 5,541,425 A | 7/1996 | Nishihara |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,065 A | 12/1996 | Miwa |
| 5,592,005 A | 1/1997 | Floyd et al. |
| 5,595,927 A | 1/1997 | Chen et al. |
| 5,597,765 A | 1/1997 | Yilmaz et al. |
| 5,605,852 A | 2/1997 | Bencuya |
| 5,616,945 A | 4/1997 | Williams |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,640,034 A | 6/1997 | Malhi |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,719,409 A | 2/1998 | Singh et al. |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,814,858 A | 9/1998 | Williams |
| 5,877,528 A | 3/1999 | So |
| 5,879,971 A | 3/1999 | Witek |
| 5,879,994 A | 3/1999 | Kwan et al. |
| 5,895,951 A | 4/1999 | So et al. |
| 5,895,952 A | 4/1999 | Darwish et al. |
| 5,897,343 A | 4/1999 | Mathew et al. |
| 5,897,360 A | 4/1999 | Kawaguchi |
| 5,900,663 A | 5/1999 | Johnson et al. |
| 5,906,680 A | 5/1999 | Meyerson |
| 5,917,216 A | 6/1999 | Floyd et al. |
| 5,929,481 A | 7/1999 | Hsieh et al. |
| 5,943,581 A | 8/1999 | Lu et al. |
| 5,949,104 A | 9/1999 | D'Anna et al. |
| 5,949,124 A | 9/1999 | Hadizad et al. |
| 5,959,324 A | 9/1999 | Kohyama |
| 5,960,271 A | 9/1999 | Wollesen et al. |
| 5,972,741 A | 10/1999 | Kubo et al. |
| 5,973,360 A | 10/1999 | Tihanyi |
| 5,973,367 A | 10/1999 | Williams |
| 5,976,936 A | 11/1999 | Miyajima et al. |
| 5,981,344 A | 11/1999 | Hshieh et al. |
| 5,981,996 A | 11/1999 | Fujishima |
| 5,998,833 A | 12/1999 | Baliga |
| 6,005,271 A | 12/1999 | Hshieh |
| 6,008,097 A | 12/1999 | Yoon et al. |
| 6,011,298 A | 1/2000 | Blanchard |
| 6,015,727 A | 1/2000 | Wanlass |
| 6,020,250 A | 2/2000 | Kenny et al. |
| 6,034,415 A | 3/2000 | Johnson et al. |
| 6,037,202 A | 3/2000 | Witek |
| 6,037,628 A | 3/2000 | Huang |
| 6,037,632 A | 3/2000 | Omura et al. |
| 6,040,600 A | 3/2000 | Uenishi et al. |
| 6,048,772 A | 4/2000 | D'Anna |
| 6,049,108 A | 4/2000 | Williams et al. |
| 6,057,558 A | 5/2000 | Yamamoto et al. |
| 6,063,678 A | 5/2000 | D'Anna |
| 6,064,088 A | 5/2000 | D'Anna |
| 6,066,878 A | 5/2000 | Neilson |
| 6,069,043 A | 5/2000 | Floyd et al. |

| | | | | | | |
|---|---|---|---|---|---|---|
| 6,081,009 | A | 6/2000 | Neilson | 6,388,287 B2 | 5/2002 | Deboy et al. |
| 6,084,264 | A | 7/2000 | Darwish | 6,400,003 B1 | 6/2002 | Huang |
| 6,084,268 | A | 7/2000 | de Frésart et al. | 6,429,481 B1 | 8/2002 | Mo et al. |
| 6,087,232 | A | 7/2000 | Kim et al. | 6,433,385 B1 | 8/2002 | Kocon et al. |
| 6,096,608 | A | 8/2000 | Williams | 6,436,779 B2 | 8/2002 | Hurkx et al. |
| 6,097,063 | A | 8/2000 | Fujihira | 6,437,399 B1 | 8/2002 | Huang |
| 6,103,578 | A | 8/2000 | Uenishi et al. | 6,441,454 B2 | 8/2002 | Hijzen et al. |
| 6,104,054 | A | 8/2000 | Corsi et al. | 6,452,230 B1 | 9/2002 | Boden, Jr. |
| 6,110,799 | A | 8/2000 | Huang | 6,461,918 B1 | 10/2002 | Calafut |
| 6,114,727 | A | 9/2000 | Ogura et al. | 6,465,304 B1 | 10/2002 | Blanchard et al. |
| 6,137,152 | A | 10/2000 | Wu | 6,465,843 B1 | 10/2002 | Hirler et al. |
| 6,150,697 | A | 11/2000 | Teshigahara et al. | 6,465,869 B2 | 10/2002 | Ahlers et al. |
| 6,156,606 | A | 12/2000 | Michaelis | 6,472,678 B1 | 10/2002 | Hshieh et al. |
| 6,156,611 | A | 12/2000 | Lan et al. | 6,472,708 B1 | 10/2002 | Hshieh et al. |
| 6,163,052 | A | 12/2000 | Liu et al. | 6,475,884 B2 | 11/2002 | Hshieh et al. |
| 6,165,870 | A | 12/2000 | Shim et al. | 6,476,443 B1 | 11/2002 | Kinzer |
| 6,168,983 | B1 | 1/2001 | Rumennik et al. | 6,479,352 B2 | 11/2002 | Blanchard |
| 6,168,996 | B1 | 1/2001 | Numazawa et al. | 6,489,652 B1 | 12/2002 | Jeon et al. |
| 6,171,935 | B1 | 1/2001 | Nance et al. | 6,501,146 B1 | 12/2002 | Harada |
| 6,174,773 | B1 | 1/2001 | Fujishima | 6,518,127 B2 | 2/2003 | Hshieh et al. |
| 6,174,785 | B1 | 1/2001 | Parekh et al. | 6,580,123 B2 | 6/2003 | Thapar |
| 6,184,545 | B1 | 2/2001 | Werner et al. | 6,608,350 B2 | 8/2003 | Kinzer et al. |
| 6,184,555 | B1 | 2/2001 | Tihanyi et al. | 6,611,021 B1 | 8/2003 | Onishi et al. |
| 6,188,104 | B1 | 2/2001 | Choi et al. | 6,673,679 B1 | 1/2004 | Miyasaka et al. |
| 6,188,105 | B1 | 2/2001 | Kocon et al. | 6,724,042 B2 | 4/2004 | Onishi et al. |
| 6,190,978 | B1 | 2/2001 | D'Anna | 6,825,537 B2 | 11/2004 | Iwamoto et al. |
| 6,191,447 | B1 | 2/2001 | Baliga | 7,023,069 B2 | 4/2006 | Blanchard |
| 6,194,741 | B1 | 2/2001 | Kinzer et al. | 7,041,560 B2 | 5/2006 | Hshieh |
| 6,198,127 | B1 | 3/2001 | Kocon | 7,052,982 B2 | 5/2006 | Hshieh et al. |
| 6,201,279 | B1 | 3/2001 | Pfirsch | 2001/0028083 A1 * | 10/2001 | Onishi et al. ................ 257/328 |
| 6,204,097 | B1 | 3/2001 | Shen et al. | 2001/0032998 A1 | 10/2001 | Iwamoto et al. |
| 6,207,994 | B1 | 3/2001 | Rumennik et al. | 2001/0041400 A1 | 11/2001 | Ren et al. |
| 6,222,233 | B1 | 4/2001 | D'Anna | 2001/0049167 A1 | 12/2001 | Madson |
| 6,225,649 | B1 | 5/2001 | Minato | 2001/0050394 A1 | 12/2001 | Onishi et al. |
| 6,228,727 | B1 | 5/2001 | Lim et al. | 2002/0009832 A1 | 1/2002 | Blanchard |
| 6,239,463 | B1 | 5/2001 | Williams et al. | 2002/0014658 A1 | 2/2002 | Blanchard |
| 6,239,464 | B1 | 5/2001 | Tsuchitani et al. | 2002/0066924 A1 | 6/2002 | Blanchard |
| 6,265,269 | B1 | 7/2001 | Chen et al. | 2002/0070418 A1 | 6/2002 | Kinzer et al. |
| 6,271,100 | B1 | 8/2001 | Ballantine et al. | 2002/0100933 A1 | 8/2002 | Marchant |
| 6,271,552 | B1 | 8/2001 | D'Anna | 2003/0060013 A1 | 3/2003 | Marchant |
| 6,271,562 | B1 | 8/2001 | Deboy et al. | 2003/0132450 A1 | 7/2003 | Minato et al. |
| 6,274,904 | B1 | 8/2001 | Tihanyi | 2003/0193067 A1 | 10/2003 | Kim et al. |
| 6,274,905 | B1 | 8/2001 | Mo | | | |
| 6,277,706 | B1 | 8/2001 | Ishikawa | | FOREIGN PATENT DOCUMENTS | |
| 6,281,547 | B1 | 8/2001 | So et al. | | | |
| 6,285,060 | B1 | 9/2001 | Korec et al. | DE | 4300806 C1 | 12/1993 |
| 6,291,298 | B1 | 9/2001 | Williams et al. | DE | 19736981 A1 | 8/1998 |
| 6,291,856 | B1 | 9/2001 | Miyasaka et al. | EP | 0975024 A2 | 1/2000 |
| 6,294,818 | B1 | 9/2001 | Fujihira | EP | 1026749 A1 | 8/2000 |
| 6,297,534 | B1 | 10/2001 | Kawaguchi et al. | EP | 1054451 A2 | 11/2000 |
| 6,303,969 | B1 | 10/2001 | Tan | EP | 0747967 B1 | 2/2002 |
| 6,307,246 | B1 | 10/2001 | Nitta et al. | EP | 1205980 A1 | 5/2002 |
| 6,309,920 | B1 | 10/2001 | Laska et al. | JP | 62-069562 | 3/1987 |
| 6,313,482 | B1 | 11/2001 | Baliga | JP | 63-186475 | 8/1988 |
| 6,316,806 | B1 | 11/2001 | Mo | JP | 63-288047 | 11/1988 |
| 6,326,656 | B1 | 12/2001 | Tihanyi | JP | 64-022051 | 1/1989 |
| 6,337,499 | B1 | 1/2002 | Werner | JP | 01-192174 A | 8/1989 |
| 6,346,464 | B1 | 2/2002 | Takeda et al. | JP | 05226638 A | 9/1993 |
| 6,346,469 | B1 | 2/2002 | Greer | JP | 2000-040822 | 2/2000 |
| 6,351,018 | B1 | 2/2002 | Sapp | JP | 2000-040872 | 2/2000 |
| 6,353,252 | B1 | 3/2002 | Yasuhara et al. | JP | 2000-156978 A | 6/2000 |
| 6,359,308 | B1 | 3/2002 | Hijzen et al. | JP | 2000-277726 A | 10/2000 |
| 6,362,112 | B1 | 3/2002 | Hamerski | JP | 2000-277728 A | 10/2000 |
| 6,362,505 | B1 | 3/2002 | Tihanyi | JP | 2001-015448 | 1/2001 |
| 6,365,462 | B2 | 4/2002 | Baliga | JP | 2001-015752 | 1/2001 |
| 6,365,930 | B1 | 4/2002 | Schillaci et al. | JP | 2001-102577 A | 4/2001 |
| 6,368,920 | B1 | 4/2002 | Beasom | JP | 2001-111041 A | 4/2001 |
| 6,368,921 | B1 | 4/2002 | Hijzen et al. | JP | 2001-135819 A | 5/2001 |
| 6,376,314 | B1 | 4/2002 | Jerred | JP | 2001-144292 A | 5/2001 |
| 6,376,878 | B1 | 4/2002 | Kocon | JP | 2001-244461 A | 9/2001 |
| 6,376,890 | B1 | 4/2002 | Tihanyi | JP | 2001-313391 A | 12/2001 |
| 6,384,456 | B1 | 5/2002 | Tihanyi | JP | 2002-083976 A | 3/2002 |
| 6,388,286 | B1 | 5/2002 | Baliga | WO | WO 00/33386 A2 | 6/2000 |

| WO | WO 00/68997 A1 | 11/2000 |
| WO | WO 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 | 9/2001 |
| WO | WO 01/95385 A1 | 12/2001 |
| WO | WO 01/95398 A1 | 12/2001 |
| WO | WO 02/01644 A2 | 1/2002 |
| WO | WO 02/47171 A1 | 6/2002 |

OTHER PUBLICATIONS

Bai et al., "Novel automated optimization of power MOSFET for 12V input, high-frequency DC-DC converter," *International Symposium on Power Semiconductors and ICs, Technical Digest*, (2003), pp. 366-369.

Baliga "New Concepts in Power Rectifiers," Physics of Semiconductor Devices, Proceedings of the Third Int'l Workshop, Madras (India), Committee on Science and Technology in Developing Countries (1985), pp. 471-481.

Baliga "Options for CVD of Dielectrics Include Low-k Materials," Technical Literature from Semiconductor International, Jun. 1998, 4 pages total.

Baliga et al., "Improving the reverse recovery of power MOSFET integral diodes by electron irradiation," (Dec. 1983) *Solid State Electronics*, vol. 26, No. 12, pp. 1133-1141.

Brown et al. Novel Trench Gate Structure Developments Set the Benchmark for Next Generation Power MOSFET Switching Performance. Power Electronics—May 2003 Proceedings (PCIM), Nurenburg, vol. 47, pp. 275-278.

Bulucea "Trench DMOS Transistor Technology For High Current (100 A Range) Switching" Solid-State Electronics vol. 34 No. pp. 493-507 (1991).

Chang et al. "Numerical and experimental Analysis of 500-V Power DMOSFET with an Atomic-Lattice Layout," IEEE Transactions on Electron Devices 36:2623 (1989).

Chang et al. "Self-Aligned UMOSFET's with a Specific On-Resistance of 1 m$\Omega$cm$^2$," IEEE Transactions on Electron Devices 34:2329-2334 (1987).

Cheng et al., "Fast reverse recovery body diode in high-voltage VDMOSFET using cell-distributed schottky contacts," (May 2003) *IEEE Transactions on Electron Devices*, vol. 50, No. 5, pp. 1422-1425.

"CoolMOS™ the second generation," Infineon Technologies product information, (2000), 2 pages total.

Curtis, et al. "APCVD TEOS: 03 Advanced Trench Isolation Applications," Semiconductor Fabtech 9th Edition (1999) 8 pages total.

Darwish et al. A New Power W-Gated Trench MOSFET (WMOSFET) with High Switching Performance. ISPSD Proceedings—Apr. 2003, Cambridge, 4 pages total.

Djekic, O. et al., "High frequency synchronous buck converter for low voltage applications," (1998) *Proc. IEEE Power Electronics Specialist Conf. (PESC)*, pp. 1248-1254.

Fujihira "Theory of Semiconductor Superjunction Devices" Jpn. J. Appl. Phys. vol. 36 pp. 6254-6262 (1997).

Gan et al. "Poly Flanked VDMOS (PFVDMOS): A Superior Technology for Superjunction Devices," IEEE Power Electronics Specialists Conference, Jun. 17-22, 2001, Vancouver, Canada (2001), 4 pages total.

Glenn et al. "A Novel Vertical Deep Trench RESURF DMOS (VTR-DMOS)" IEEE ISPD 2000, May 22-25, Toulouse France, pp. 197-200.

"IR develops CoolMOS™ -equivalent technology, positions it at the top of a 3-tiered line of new products for SMPS," International Rectifiers company information available at http://www.irf.com (1999) 3 pages total.

Kao et al. "Two Dimensional Thermal Oxidation of Silicon-I. Experiments,", *IEEE Transactions on Electron Devices*, vol. ED-34,No. 5, May 1987, pp. 1008-1017.

Kao et al. "Two Dimensional Thermal Oxidation of Silicon-II. Modeling Stress Effects in Wet Oxides," *IEEE Transactions on Electron Devices*, vol. ED-35, No. 1, Jan. 1988, pp. 25-37.

Kassakian, J.G. et al., "High-frequency high-density converters for distributed power supply systems," (Apr. 1988) *Proceedings of the IEEE*, vol. 76, No. 4, pp. 362-376.

Korman, C.S. et al., "High performance power DMOSFET with integrated schottky diode," (1989) *Proc. IEEE Power Electronics Specialist Conf. (PESC)*, pp. 176-179.

Lorenz et al., "Cool MOS- An important milestone towards a new power MOSFET generation" Power Conversion pp. 151-160 (1988).

Maksimovic, A.M. et al., "Modeling and simulation of power electronic converters," (Jun. 2001) *Proceedings of the IEEE*, vol. 89, No. 6, pp. 898-912.

Mehrotra, M. et al., "Very low forward drop JBS rectifiers fabricated using submicron technology," (Nov. 1993) *IEEE Transactions on Electron Devices*, vol. 40, No. 11, pp. 2131-2132.

Moghadam "Delivering Value Around New Industry Paradigms," Technical Literature from Applied Materials, pp. 1-11, vol. 1, Issue 2, Nov. 1999.

Park et al., "Lateral Trench Gate Super-Junction SOI-LDMOSFETs with Low On-Resistance," Institute for Microelectronics, University of Technology Vienna, Austria (2002), pp. 283-285.

Sakai et al., "Experimental investigation of dependence of electrical characteristics of device parameters in trench MOS barrier, schottky diodes," (1998) *International Symposium on Power Semiconductors and ICs, Technical Digest*, pp. 293-296.

Shenai et al., "Current transport mechanisms in atomically abrupt metal-semiconductor interfaces," (Apr. 1988) *IEEE Transactions on Electron Devices*, vol. 35, No. 4, pp. 468-482.

Shenai et al., "Monolithically integrated power MOSFET and schottky diode with improved reverse recovery characteristics," (Apr. 1990) *IEEE Transactions on Electron Devices*, vol. 37, No. 4, pp. 1167-1169.

Shenoy et al."Analysis of the Effect of Charge Imbalance on the Static and Dynamic Characteristic of the Super Junction MOSFET," IEEE International Symposium on Power Semiconductor Devices 1999, pp. 99-102 (1999).

Singer "Empty Spaces in Silicon (ESS): An Alternative to SOI," Semiconductor International p. 42, Dec. 1999.

Tabisz et al., "A MOSFET resonant synchronous rectifier for high-frequency dc/dc converters," (1990) *Proc. IEEE Power Electronics Specialist Conf.* (PESC), pp. 769-779.

Technical Literature from Quester Technology, Model APT-4300 300mm Atmospheric TEOS/Ozone CVD System, (unknown date), 3 pages total.

Technical Literature from Quester Technology, Model APT-6000 Atmospheric TEOS-Ozone CVD System, (unknown date), 2 pages total.

Technical Literature from Silicon Valley Group Thermal Systems, APNext, High Throughput APCVD Cluster Tool for 200 mm/300 mm Wafer Processing, (unknown date), 2 pages total.

Tu et al. "On the reverse blocking characteristics of schottky power diodes," (Dec. 1992) *IEEE Transactions on Electron Devices*. vol. 39, No. 12, pp. 2813-2814 2 pages total.

Ueda et al. "An Ultra-Low On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 26:491-493 (1983).

Wolf, "Silicon Processing for The VLSI Era" vol. 2 Process Integration Lattice Press (1990), 3 pages total.

Yamashita et al., Conduction Power loss in MOSFET synchronous rectifier with parallel-connected schottky barrier diode, (Jul. 1998) *IEEE Transactions on Power electronics*, vol. 13, No. 4, pp. 667-673.

\* cited by examiner

SUPERJUNCTION SEMICONDUCTOR DEVICE

CROSS-REFERENCES TO RELATED APPLICATIONS

This application is a continuation of U.S. application Ser. No. 10/999,578, filed Nov. 29, 2004, which claims priority from Korean Patent Appln. No. 10-2003-0085765, filed Nov. 28, 2003, both of which are incorporated by reference in their entirety.

BACKGROUND OF THE INVENTION

The present invention relates to a semiconductor device, and more particularly to a superjunction semiconductor device having alternating columns of p-type and n-type conductivity type material in the active and termination regions.

Typically, in vertically conducting semiconductor devices the electrodes are disposed on two opposing planes. When the vertical semiconductor device is turned on, drift current flows along the thickness (i.e., vertical direction) of the semiconductor device. When the device is turned off, depletion regions extend vertically. To realize high breakdown voltage for a vertical semiconductor device, a drift layer between the electrodes must be made from a high resistivity material and have a relatively large thickness. However, the high resistivity and the relatively large thickness of the drift layer increase the on-resistance of the device. A higher on-resistance adversely affects the performance of the device by increasing the conduction loss and lowering the switching speed. It is well known that on-resistance of a device rapidly increases in proportion to the $2.5^{th}$ power of a breakdown voltage (B. Jayant Baliga, Power Semiconductor Devices, 1996, PWS Publishing Company, page 373).

One technique to overcome this problem has been to use a semiconductor device with a particular junction structure. Such semiconductor device includes alternating columns of opposite conductivity type material formed in a drift layer in the active region of the device. The alternating columns of opposite conductivity type material provide a current path when the device is turned on while it is depleted to withstand the reverse voltage when the device is turned off. A semiconductor device with alternating columns of opposite conductivity type material is hereinafter referred to as a "superjunction semiconductor device".

For a superjunction semiconductor device, breakdown voltage of the device can be approximated by the product of the thickness of the drift layer and the threshold electric field. In particular, if the charge quantities in the alternately arranged columns of high concentration n-type and p-type material are in equilibrium with each other, the breakdown voltage becomes independent of the resistivity of the drift layer. For this reason, reducing the resistivity of the drift layer does not lead to a drop in breakdown voltage, thus realizing high breakdown voltage and low on-resistance at the same time.

Despite the above advantages, the superjunction semiconductor device has a drawback in that it is difficult to stably implement a termination region surrounding the active region. This is because the low resistivity of the drift layer (due to high impurity concentration) causes the lateral electric field distribution in the transition region from the active region to the termination region irregular, thus reducing the stability of the device. Furthermore, vertical electric field distribution must meet predetermined conditions for obtaining high breakdown voltage. If the vertical electric field distribution is ignored, the breakdown voltage in the termination region may be undesirably lower than in the active region.

Thus, there is a need for a superjunction semiconductor device wherein both the on-resistance and breakdown voltage are improved.

BRIEF SUMMARY OF THE INVENTION

In accordance with an aspect of the present invention, a superjunction semiconductor device has a termination structure which results in a higher breakdown voltage in the termination region than that in the active region.

In one embodiment of the invention, a superjunction semiconductor device includes an active region and a termination region surrounding the active region. A central vertical axis of a boundary column of a second conductivity type material defines the boundary between the active region and the termination region. The active region and the termination region include columns of first conductivity type material and columns of second conductivity type material alternately arranged on both sides of the boundary column. A difference between a first conductivity type charge quantity within a first column of the first conductivity type material in the termination region adjoining the boundary column and a second conductivity type charge quantity in one half of the boundary column and one half of a second column of the second conductivity type material in the termination region adjoining the first column is less than the difference between a first conductivity type charge quantity within a third column of the first conductivity type material in the active region adjoining the boundary column and a second conductivity type charge quantity in one half of the boundary column and one half of a fourth column of the second conductivity type material in the active region adjoining the third column.

In another embodiment of the invention, a superjunction semiconductor device includes an active region and a termination region surrounding the active region. A central vertical axis of a boundary column of a second conductivity type material defines the boundary between the active region and the termination region. The active and termination regions include columns of first and second conductivity type material alternately arranged along a horizontal direction in a semiconductor region having top and bottom surfaces. A spacing between the central vertical axis of the boundary column and a central vertical axis of a first column of the second conductivity type material in the termination region located closest to the boundary column is less than the spacing between the central vertical axis of the boundary column and a central vertical axis of a second column of the second conductivity type material in the active region located closest to the boundary column.

In yet another embodiment of the invention, a superjunction semiconductor device includes an active region and a termination region surrounding the active region. A central vertical axis of a boundary column of a second conductivity type material defines the boundary between the active region and the termination region. The active and termination regions include columns of first and second conductivity type material alternately arranged along a horizontal direction in a semiconductor region having top and bottom surfaces. The spacing between the central vertical axes of the boundary column and a first column of the second conductivity type material in the termination region placed closest to the boundary column is equal to the spacing between the central vertical axes of the boundary column and a second column of the second conductivity type material in the active region placed closest to the boundary column. The width of the first column is greater than the width of the second column.

In yet another embodiment of the invention, a superjunction semiconductor device includes an active region and a termination region surrounding the active region. A central vertical axis of a boundary column of a second conductivity type material defines the boundary between the active region and the termination region. The active and termination regions include columns of first and second conductivity type material alternately arranged along a horizontal direction in a semiconductor region having top and bottom surfaces. The spacing between the central vertical axes of adjacent columns of the second conductivity type material in the termination region becomes progressively greater in a direction away from the active region along a horizontal direction. At least one of the columns of the first conductivity type material in the termination region has a different width than a width of the columns of the first conductivity type material in the active region.

In yet another embodiment of the invention, a superjunction semiconductor device includes an active region and a termination region surrounding the active region. A central vertical axis of a boundary column of a second conductivity type material defines the boundary between the active region and the termination region. The active and termination regions include columns of first and second conductivity type material alternately arranged along a horizontal direction in a semiconductor region having top and bottom surfaces. At least one of the columns of the first conductivity type material in the termination region has a different width than a width of the columns of the first conductivity type material in the active region.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF THE INVENTION

This invention may, however, be embodied in many different forms and should not be construed as being limited to the embodiments set forth herein.

Figure 1:
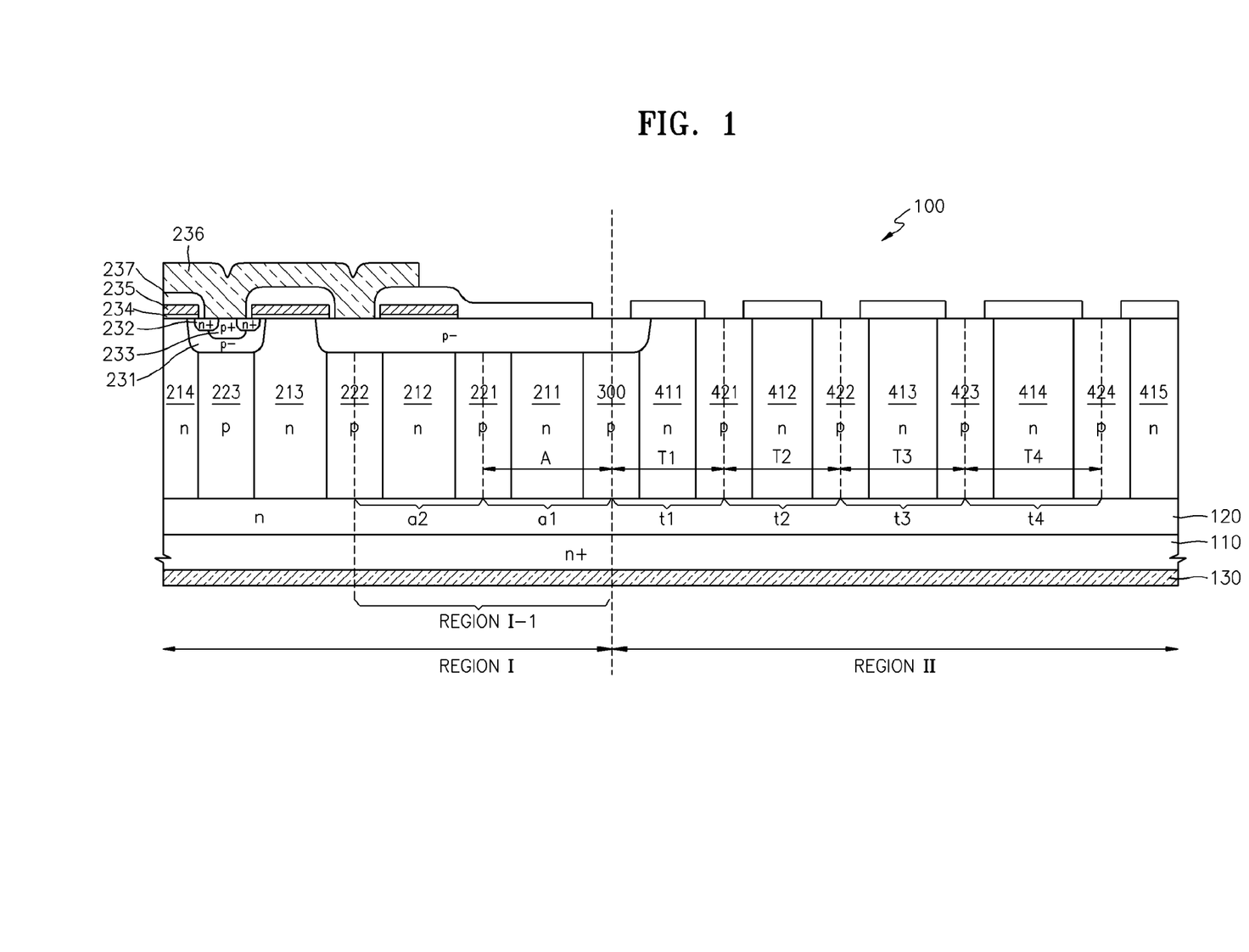
FIG. 1 is a cross-section view of a superjunction semiconductor device according to an embodiment of the present invention.

Referring to FIG. 1, a superjunction semiconductor device 100 according to an embodiment of this invention includes an active region I and a termination region II. Although it is not shown in FIG. 1, termination region II surrounds an edge region I-1. In general, edge region I-1 indicates the outermost region of active region I. In active region I and termination region II, an n-type region 120 is formed on an n-type semiconductor substrate 110 serving as the drain region. A drain electrode 130 is formed on the rear surface of drain region 110.

Columns of n-type and p-type material are alternately arranged in the lateral direction on n-type region 120 in both active region I and termination region II. Boundary column 300 of p-type material forms the transition region between active region I and termination region II. That is, active region I and termination region II are formed on the left and right sides of a central vertical axis of boundary column 300, respectively. The invention is not limited to the particular number of times the alternating p-type and n-type columns are repeated in FIG. 1. Thus, the alternating p-type and n-type columns may be repeated a greater or smaller number of times than that shown in FIG. 1 as dictated by the design and performance goals. Also, only a portion of the active region of the device is shown in FIG. 1. As is well known in this art, the planar gate cell structure shown at the far left edge of active region I is repeated many times.

The bottom surfaces of the alternating columns of p-type and n-type material in active region I-1 and termination region II are separated from drain region 110 by the intervening n-type region 120. In an alternate embodiment, the bottom surfaces of the alternating columns of p-type and n-type material are in contact with the top surface of drain region 110 without the intervening n-type region 120. A first edge region a1 closest to termination region II, which is the outermost region of active region I, includes one half of column 300, n-type column 211, and one half of p-type column 221. The p-type charge quantity within p-type columns 300 and 221 in the first edge region a1 is smaller than the n-type charge quantity within n-type column 211. This is because the sum of the widths of p-type columns 300 and 221 is smaller than the width of n-type column 211. The first edge region a1 where p-type charge quantities are not in balance with n quantities does not have an optimal breakdown voltage level. This is also the case with an adjacent second edge region a2 because the first and second edge regions a1 and a2 have the same structure.

As in active region I, n-type columns 411, 412, 413, 414, and 415 and p-type columns 421, 422, 423, and 424 in termination region II are alternately arranged starting from p-type column 300. The widths of p-type columns 421, 422, 423, and 424 are the same as those of p-type columns 221, 222, and 223 in active region I. The largest potential in the termination region II is applied to a first termination region t1 closest to active region I. Thus, the breakdown characteristics of termination region II is significantly impacted by the first termination region t1 closest to active region I. The first termination region t1 includes one half of p-type boundary column 300, n-type column 411, and one half of p-type column 421.

Spacing T1 between the central vertical axes of p-type columns 300 and 421 in the first termination region t1 is less than spacing A between the central vertical axes of p-type regions 300 and 221 in the first active edge region a1. This means that the p-type charge quantity within p-type columns 300 and 421 and the n-type charge quantity within n-type column 411 in the first termination region t1 are better balanced against each other than in the first active edge region a1. That is, in the first active region a1, the n-type charge quantity is larger than the p-type charge quantity. But, in termination region t1, while the p-type charge quantity remains the same as that in edge region a1, the n-type charge quantity is lower than that in edge region a1 since the spacing T1 is less than the spacing A. This reduces the difference in quantity between the p-type and n-type charges termination region t1 so that both charge quantities may substantially equal. As the difference between the p-type and n-type charge quantities decreases in this way, the first termination region t1 exhibits higher breakdown voltage characteristics compared to active region I.

A second termination region t2 adjacent to the first termination region t1 includes one-half of p-type column 421, the entire n-type column 412, and one-half of p-type column 422. A third termination region t3 adjacent to the second termination region t2 includes one-half of p-type column 422, the entire n-type column 413, and one-half of p-type column 423.

A fourth termination region t4 adjoining the third termination region t3 includes one-half of p-type column 423, the entire n-type column 414, and one-half of p-type column 424.

Spacing T2 between the central vertical axes of p-type column 421 and 422 in the second termination region t2 is greater than spacing T1 in the first termination region t1. In an alternate embodiment, spacing T2 is equal to spacing T1. Spacing T3 between the central vertical axes of p-type columns 422 and 423 in the third termination region t3 is greater than spacing T2. Spacing T4 between the central vertical axes of p-type columns 423 and 424 in the fourth termination region t4 is greater than spacing T3. This makes it possible to transmit the electric field which was concentrated at the first active edge region a1 and transmitted to the first termination region t1 toward the edge of termination region II at slower speed, thus realizing uniform horizontal distribution of electric field across the entire termination region II.

Along the far left side of active region I, a planar gate cell structure is shown. Although not show, this cell structure is repeated a predetermined number of times in the active region. The planar gate structure includes a lightly doped p-type well region 231 which is over and in contact with a top surface of p-type column 223. Two highly doped n-type source regions 232 are formed in well region 231. A highly doped p-type well contact region 233 is formed in well region 231 between the two source regions 232. A gate insulating layer 234 and an overlying gate electrode 235 are formed on each side of well contact region 233. The gate insulating layer and its overlying gate electrode to the right of well contact region 233 overlap the source region on the right side of well region 233, extend over a channel region along the top surface of well region 231 between the right source region and n-type column 213, and extend over the adjacent n-type column 213. The gate insulating layer and its overlying gate electrode to the left of well contact region 233 have a similar structure. A source electrode 236 contacts the two source regions 232 and well contact region 233 therebetween. Gate electrode 235 and source electrode 236 are electrically insulated from each other by an insulating layer 237.

The operation of superjunction semiconductor device 100 will now be described. When the device is turned on upon applying the proper biasing to the gate, drain and source electrodes, an inversion layer is formed in the channel regions within well region 231. A current path from source regions 232 laterally through the channel region, and then vertically through n-type columns 213, 214, n-type region 120, substrate 110, and drain electrode 130 is formed. Current flow between source electrode 236 and drain electrode 130 is thus established. When the device is turned off, no current flows between the source and gate terminals, and the diode formed by the drain and well regions is reverse biased. The reverse bias causes a depletion region to extend in both the p-type and the n-type columns. The p-type and n-type columns are depleted rapidly since the depletion region extends in both directions at the same time. This makes it possible reduce the on-resistance by increasing the doping concentration in n-type columns 211, 212, 213, and 214 without adversely impacting the breakdown characteristics.

Figure 2:
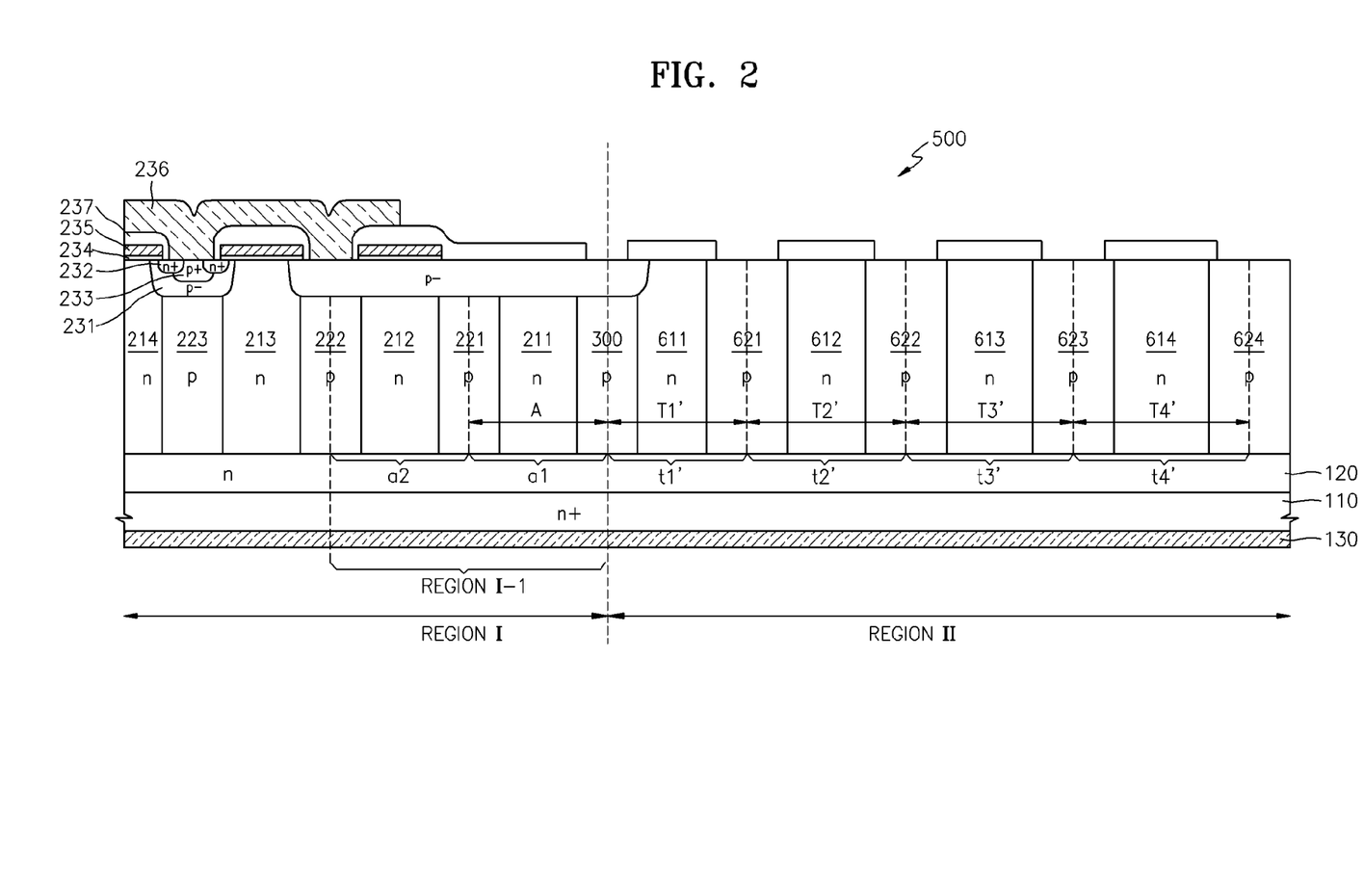
FIG. 2 is a cross-section view of a superjunction semiconductor device according to another embodiment of the present invention.

FIG. 2 illustrates a cross-section view of a superjunction semiconductor device 500 according to another embodiment of this invention. In FIG. 2, the same reference numerals as in FIG. 1 represent the same element, so a detailed description thereof will be omitted. Superjunction semiconductor device 500 is different from the embodiment in FIG. 1 in that spacing T1' between the central vertical axes of p-type columns 300 and 621 in a first termination region t1' is equal to spacing A between the central vertical axes of p-type columns 300 and 221 of the first active edge region a1. Another difference is that the widths of p-type columns 621, 622, 623, and 624 in termination region II differs from the width of p-type boundary column 300 and those of p-type columns 221, 222, and 223 in active region I.

Specifically, active region I in superjunction semiconductor device 500 is the same as that in superjunction semiconductor device 100 in FIG. 1. However, spacing T1' between the central vertical axes of p-type columns 300 and 621 of the first termination region t1' located closest to active region I is equal to spacing A between the central vertical axes of p-type columns 300 and 221 of the first edge region a1. Furthermore, the widths of the p-type columns in termination region II are greater than the width of p-type boundary column 300 and the p-type columns in active region I. Consequently, the width of p-type region 621 in the first termination region t1' is greater than those in the active region such that the p-type charge quantity in termination region t1' increases relative to those in active region a1, while the n-type charge quantity decreases in termination region t1' relative to those in active region a1. Thus, the difference between the p-type charge quantity and the n-type charge quantity in the first termination region t1' is less than that in active region a1. Breakdown characteristics are thus improved.

Further, in superjunction semiconductor device 500, spacing T2' between the central vertical axes of p-type columns 621 and 622 in a second termination region t2' is greater than the spacing T1' in the first termination region t1'. In one embodiment, spacing T2' is equal to spacing T1'. Spacing T3' between the central vertical axes of p-type columns 622 and 623 in a third termination region t3' is greater than spacing T2' in the second termination region t2'. Spacing T4' between the central vertical axes of p-type regions 623 and 624 in a fourth termination region t4' is greater than the spacing T3' in the third termination region t3'. This makes it possible to transmit the electric field, which was concentrated at the first edge region a1 of active region I and transmitted to the first termination region t1', toward the edge of termination region II less rapidly, thus realizing a uniform horizontal distribution of electric field across the entire termination region II.

As described above, a superjunction semiconductor device according to this invention has a more balanced p-type and n-type charge quantities in the termination region near the active region than in the active region, thus allowing the termination region to have higher breakdown voltage than the active region. Furthermore, this invention allows stable distribution of electric field on the surface of the device by changing the spacing between the p-type columns (or the n-type columns) in the termination region thereby improving the device reliability.

The cross-section views of the different embodiments may not be to scale, and as such are not intended to limit the possible variations in the layout design of the corresponding structures. Also, the various transistors can be formed in stripe or cellular architectures.

Although a number of specific embodiments are shown and described above, embodiments of the invention are not limited thereto. Various changes and modifications will occur to those For example, it is understood that the doping polarities of the structures shown and described could be reversed (e.g., to obtain p-type or n-type transistors) and/or the doping concentrations of the various elements could be altered without departing from the invention. As another example, although only a planar gate structure is shown in FIGS. 1 and 2, implementation of the invention with other transistor structures such as trenched-gate structures would be obvious to one skilled in this art in view of this disclosure. Also, the invention may be implemented in other types of MOS-gated FETs such as IGBT's. Further, the features of one or more embodiments of the invention may be combined with one or more features of other embodiments of the invention without departing from the scope of the invention. Therefore, the scope of the present invention should be determined not with reference to the above description but should, instead, be determined with reference to the appended claims, along with their full scope of equivalents.

What is claimed is:

1. A superjunction semiconductor device having an active region and a termination region surrounding the active region, a central vertical axis of a boundary column of a second conductivity type material defining the boundary between the active region and the termination region, the active and termination regions including columns of first and second conductivity type material alternately arranged along a horizontal direction in a semiconductor region having top and bottom surfaces,
   wherein the spacing between the central vertical axes of the boundary column and a first column of the second conductivity type material in the termination region placed closest to the boundary column is equal to the spacing between the central vertical axes of the boundary column and a second column of the second conductivity type material in the active region placed closest to the boundary column, and the width of the first column is greater than the width of the second column.

2. The superjunction semiconductor device of claim 1, wherein the width of a third column of the first conductivity type material in the active region is greater than the sum of one-half the width of a fourth column of the second conductivity type material adjoining one side of the third column and one-half the width of a fifth column of the second conductivity type material adjoining the opposite side of the third column.

3. The superjunction semiconductor device of claim 1, wherein the spacing between the central vertical axes of adjacent columns of the second conductivity type material in the termination region varies along a horizontal direction.

4. The superjunction semiconductor device of claim 1, wherein the spacing between the central vertical axes of adjacent ones of at least three columns of the second conductivity type material in the termination region becomes progressively greater in a direction away from the active region.

5. The superjunction semiconductor device of claim 1, wherein the first conductivity type is n-type, and the second conductivity type is p-type.

6. The superjunction semiconductor device of claim 1, wherein the active region further comprises a plurality of planar-gate structures formed along the top surface of the semiconductor region.

7. A superjunction semiconductor device having an active region and a termination region surrounding the active region, a central vertical axis of a boundary column of a second conductivity type material defining the boundary between the active region and the termination region, the active and termination regions including columns of first and second conductivity type material alternately arranged along a horizontal direction in a semiconductor region having top and bottom surfaces,
   wherein the spacing between the central vertical axes of adjacent columns of the second conductivity type material in the termination region becomes progressively greater in a direction away from the active region along a horizontal direction.

8. The superjunction semiconductor device of claim 7 wherein the active region further comprises a plurality of planar-gate structures formed along the top surface of the semiconductor region.

9. A superjunction semiconductor device having an active region and a termination region surrounding the active region, a central vertical axis of a boundary column of a second conductivity type material defining the boundary between the active region and the termination region, the active and termination regions including columns of first and second conductivity type material alternately arranged in a semiconductor region,
   wherein at least one of the columns of the first conductivity type material in the termination region has a different width than a width of the columns of the first conductivity type material in the active region, and wherein the columns of the second conductivity type material in the termination and active regions are of the same width.

10. The superjunction semiconductor device of claim 1, wherein a sum of a second conductivity type charge quantity in one half of the boundary column and one half of the first column is greater than a sum of a second conductivity type charge quantity in one half of the boundary column and one half of the second column.

11. The superjunction semiconductor device of claim 1, wherein a first conductivity type charge quantity in a third column of the first conductivity type material in the termination region adjoining the boundary column is less than a first conductivity type charge quantity in a fourth column of the first conductivity type material in the active region adjoining the boundary column.

12. The superjunction semiconductor device of claim 1, wherein a difference between a first conductivity type charge quantity in a third column of the first conductivity type material in the termination region adjoining the boundary column and a sum of a second conductivity type charge quantity in one half of the boundary column and one half of the first column is less than the difference between a first conductivity type charge quantity in a fourth column of the first conductivity type material in the active region adjoining the boundary column and a sum of a second conductivity type charge quantity in one half of the boundary column and one half of the second column.

13. The superjunction semiconductor device of claim 7 wherein widths of adjacent columns of the first conductivity type material in the termination region become progressively greater in the direction away from the active region along the horizontal direction.

14. The superjunction semiconductor device of claim 7 wherein widths of the columns of the second conductivity type material in the termination region are substantially equal.

15. The superjunction semiconductor device of claim 7 wherein the first conductivity type material is n-type, and the second conductivity material type is p-type.

16. The superjunction semiconductor device of claim 9 wherein a spacing between central vertical axes of adjacent columns of the second conductivity type material in the termination region becomes progressively greater in a direction away from the active region along a horizontal direction.

17. The superjunction semiconductor device of claim 9 wherein a sum of a second conductivity type charge quantity in one half of the boundary column and one half of a first column of the second conductivity type material in the termination region placed closest to the boundary column is greater than a sum of a second conductivity type charge quantity in one half of the boundary column and one half of a second column of the second conductivity type material in the active region placed closest to the boundary column.

18. The superjunction semiconductor device of claim 9 wherein a first conductivity type charge quantity in a first column of the first conductivity type material in the termination region adjoining the boundary column is less than a first conductivity type charge quantity in a second column of the first conductivity type material in the active region adjoining the boundary column.

19. The superjunction semiconductor device of claim 9 wherein the first conductivity type material is n-type, and the second conductivity type material is p-type.

20. The superjunction semiconductor device of claim 9 wherein the active region further comprises a plurality of planar-gate structures formed along a top surface of the semiconductor region.

* * * * *